United States Patent
Ito

(10) Patent No.: US 7,269,081 B2
(45) Date of Patent: Sep. 11, 2007

(54) PROGRAM CIRCUIT OF SEMICONDUCTOR

(75) Inventor: Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 11/360,670

(22) Filed: Feb. 24, 2006

(65) Prior Publication Data

US 2006/0193163 A1 Aug. 31, 2006

(30) Foreign Application Priority Data

Feb. 25, 2005 (JP) ............................. 2005-051807

(51) Int. Cl.
*G11C 5/14* (2006.01)
*G11C 17/00* (2006.01)

(52) U.S. Cl. ..................... 365/189.09; 365/94; 365/96; 365/104

(58) Field of Classification Search ........... 365/189.09, 365/94, 96, 97, 104
See application file for complete search history.

(56) References Cited

U.S. PATENT DOCUMENTS 6,549,458 B1* 4/2003 Rao et al. .............. 365/185.08
6,671,040 B2* 12/2003 Fong et al. ............. 365/189.08
6,920,070 B2* 7/2005 Imai ....................... 365/189.09
2005/0226078 A1 10/2005 Ito et al.

OTHER PUBLICATIONS

U.S. Appl. No. 11/221,943, filed Sep. 9, 2005, Namekawa, et al.
U.S. Appl. No. 11/052,052, filed Feb. 8, 2005, Namekawa, et al.
U.S. Appl. No. 11/231,983, filed Sep. 22, 2005, Nakano, et al.

* cited by examiner

*Primary Examiner*—Amir Zarabian
*Assistant Examiner*—Anthan Tran
(74) *Attorney, Agent, or Firm*—Oblon, Spivak, McClelland, Maier & Neustadt, P.C.

(57) ABSTRACT

A semiconductor integrated circuit device includes a storage element, program circuit, and sensing circuit. The storage element stores information by electrically irreversibly changing the element characteristics. The program circuit programs the storage element by electrically irreversibly changing its element characteristics. The sensing circuit senses the irreversibly changed element characteristics of the storage element in distinction from an unchanged state. The program circuit includes a high-voltage generator which irreversibly changes the element characteristics of the storage element by applying a high voltage to it, and a current source which supplies an electric current to the storage element having element characteristics changed by the high-voltage generator, thereby stabilizing the element characteristics.

11 Claims, 2 Drawing Sheets

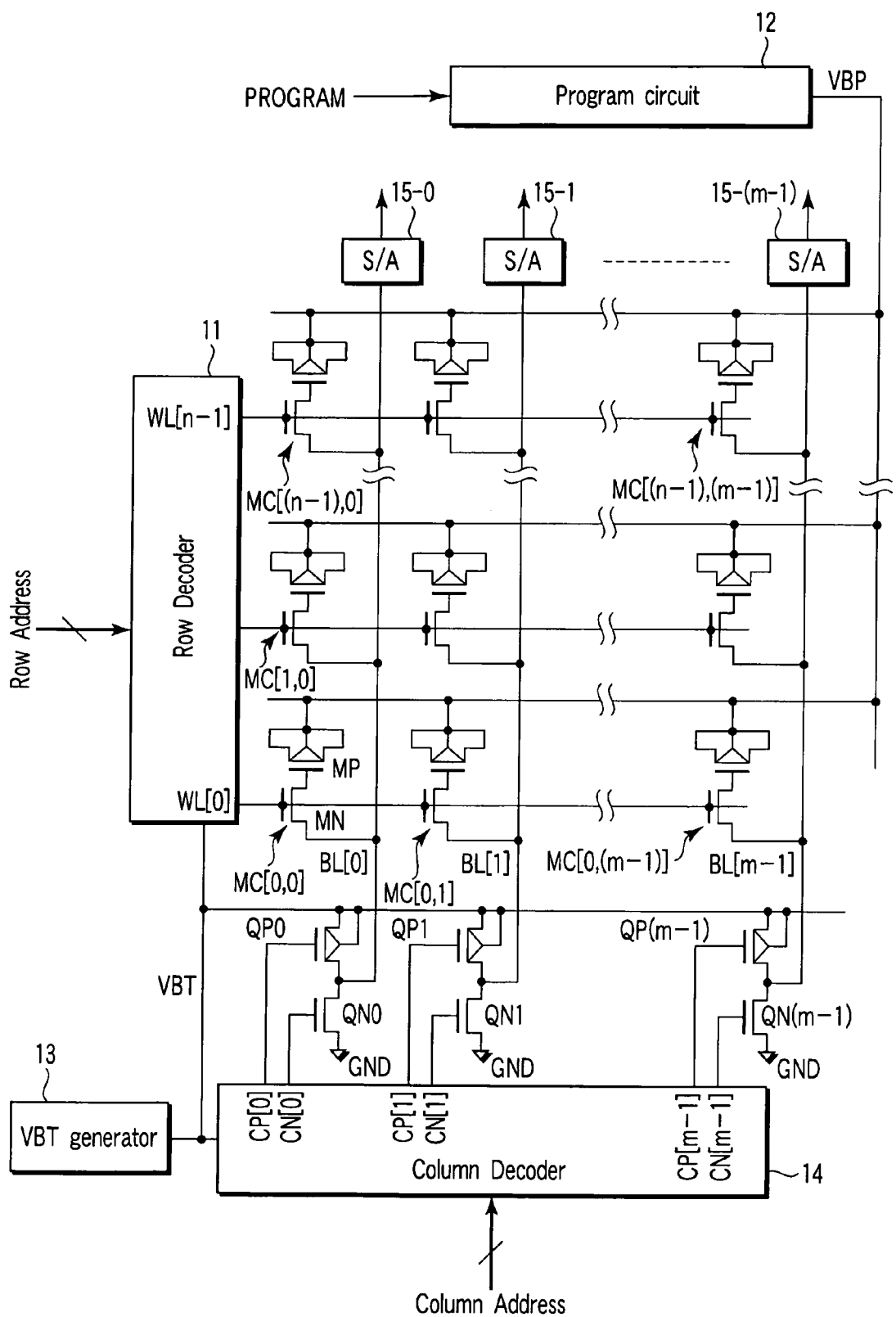
F I G. 2

PROGRAM CIRCUIT OF SEMICONDUCTOR

CROSS-REFERENCE TO RELATED APPLICATIONS

This application is based upon and claims the benefit of priority from prior Japanese Patent Application No. 2005-051807, filed Feb. 25, 2005, the entire contents of which are incorporated herein by reference.

BACKGROUND OF THE INVENTION

1. Field of the Invention

The present invention relates to a semiconductor integrated circuit device including a semiconductor one-time programmable memory using an electrically programmable irreversible storage element and, more particularly, to a program circuit of a semiconductor one-time programmable memory.

2. Description of the Related Art

In the recent semiconductor integrated circuit devices, a nonvolatile one-time programmable (OTP) memory in which stored data does not disappear even when power supply stops is an essential element. The OTP memory is widely used in, e.g., redundancy of a large-capacity memory such as a DRAM or SRAM, tuning of an analog circuit, storage of a code such as an encryption key, and a chip ID for storing management information such as a log in a fabrication process.

For example, a ROM using a laser fuse which is the most inexpensive nonvolatile memory is used for memory redundancy. The laser fuse stores information by blowing upon being irradiated with a laser beam, thereby causing an irreversible change. When the laser fuse ROM is used, however, a fuse blow equipment for programming and a blow step using the same are necessary. In addition, since the minimum dimension of the laser fuse is determined by the wavelength of the laser beam used, downsizing of the fuse cannot keep step with that of other semiconductor devices. Therefore, as downsizing of the other semiconductor devices advances, the ratio of the area occupied by the laser fuse in the chip gradually increases.

Furthermore, since programming of the laser fuse ROM requires irradiation with the laser beam as described above, programming can be performed only in a wafer state. This makes it impossible to perform, e.g., remedy of defects by a high-speed test after packaging, or built-in self repair using a built-in test circuit of a chip. Accordingly, it is being required an electrically programmable nonvolatile memory even in a system using the laser fuse.

On the other hand, in a system formed by using a plurality of chips, various pieces of information can be stored in independent EEPROM chips. However, in an SoC (System on Chip) in which the system is integrated on one chip, a nonvolatile memory must be formed inside the chip. Therefore, embedding a nonvolatile memory which stores electric charge in the floating gate requires additional masks and fabrication processes, and increases the fabrication cost.

Generally, not all information stored in a nonvolatile memory such as redundancy information of the memory need be multi-time Programmable. Accordingly, the OTP (One-Time Programmable) memory which can be embedded by the presently standard CMOS process presumably has a wide demand.

Storage elements which are used in the OTP memory and store information by irreversibly changing the element characteristics will be generally referred to as fuse elements hereinafter. Also, of the fuse elements, those which electrically irreversibly change the element characteristics will be generally referred to as e-fuses (electrical fuses) hereinafter.

Examples of the e-fuse are a poly e-fuse or metal e-fuse which changes the resistance value by supplying a large electric current to a line which is made of polysilicon or a metal in order to intentionally increase the current density, and a gate oxide e-fuse (Gate-Ox eFuse) which causes dielectric breakdown by applying a high voltage to the gate oxide of a MOS transistor, and uses the decrease in resistance caused by the formation of a conduction spot.

For example, a cell of the OTP memory using the gate oxide e-fuse described above is formed as shown in FIG. 5A of Hiroshi Ito et al., "Pure CMOS One-Time Programmable Memory using Gate-Ox Anti-fuse", Proceedings of the IEEE 2004 CUSTOM INTEGRATED CIRCUITS CONFERENCE, pp. 469-472. In this reference, the cell is formed by using a fabrication process which supports a MOS transistor including gate oxide films having two or more types of thicknesses. A P-channel MOS transistor MP0 as the e-fuse element has a thin oxide film, and other MOS transistors have thick oxide films. An N-channel MOS transistor MN0 controls a gate voltage VBT to an appropriate level, thereby limiting the voltage of a node n0 to "VBT-Vth" (Vth is the threshold voltage of the MOS transistor MN0), and preventing the application of a high voltage to a MOS transistor connected to the node n0. This MOS transistor will be referred to as a barrier transistor hereinafter.

Assume that in a programmable state, a terminal VBP is at a high voltage for programming, a terminal VBT is at an appropriate voltage between a VDD level and VBP level, and a terminal PRGp is at a GND level. To program the e-fuse, i.e., to breakdown the gate oxide of the MOS transistor MP0, the terminal PRGp is raised from the GND to a power supply voltage VDD, thereby turning on a MOS transistor MN1, and lowering the node n0 and a node n1 to the GND level. Consequently, the high voltage VBP is applied to the gate oxide of the MOS transistor MP0 to cause breakdown within a short time.

A Joule heat generated when an electric current concentrates to a narrow breakdown spot immediately after the breakdown irreversibly forms a conductive spot having a relatively low resistance. If, however, the effect of the Joule heat immediately after the breakdown is insufficient, the resistance value rises with time to produce an unstable state, and this may finally make data unreadable and lost.

In the gate oxide e-fuse as described above, after dielectric breakdown of the gate oxide occurs, an electric current of about a few mA is supplied to the breakdown spot to obtain a hard breakdown state by the generated Joule heat. This is important to stabilize the characteristics after the breakdown. If the effect of the Joule heat is unsatisfactory, an incomplete breakdown state called soft breakdown occurs, and this may raise the resistance again to make data disappear.

To ensure the reliability, therefore, the characteristics are conventionally stabilized by obtaining a hard breakdown state by raising the current supply capability of a charge pump circuit which generates a high voltage for programming to about a few mA which is probably necessary after the breakdown. However, the charge pump circuit is normally a multistage circuit including four to five stages, so a large-capacity boosting capacitor is necessary to raise the current supply capability. As a consequence, the pattern occupied area of the program circuit, particularly, the charge pump circuit increases in the OTP memory, and this decreases the layout efficiency.

BRIEF SUMMARY OF THE INVENTION

According to an aspect of the present invention, there is provided a semiconductor integrated circuit device comprising a storage element configured to store information by electrically irreversibly changing element characteristics, a program circuit configured to program the storage element by electrically irreversibly changing the element characteristics thereof, the program circuit comprising a high-voltage generator which irreversibly changes the element characteristics of the storage element by applying a high voltage thereto, and a current source which supplies an electric current to the storage element having element characteristics changed by the high-voltage generator, thereby stabilizing the element characteristics, and a sensing circuit configured to sense the irreversibly changed element characteristics of the storage element in distinction from an unchanged state.

BRIEF DESCRIPTION OF THE SEVERAL VIEWS OF THE DRAWING

FIG. 2 is a circuit diagram for explaining the semiconductor integrated circuit device according to the embodiment of the present invention, in which an outline of the arrangement of a semiconductor one-time programmable memory is illustrated.

DETAILED DESCRIPTION OF THE INVENTION

Figure 1:
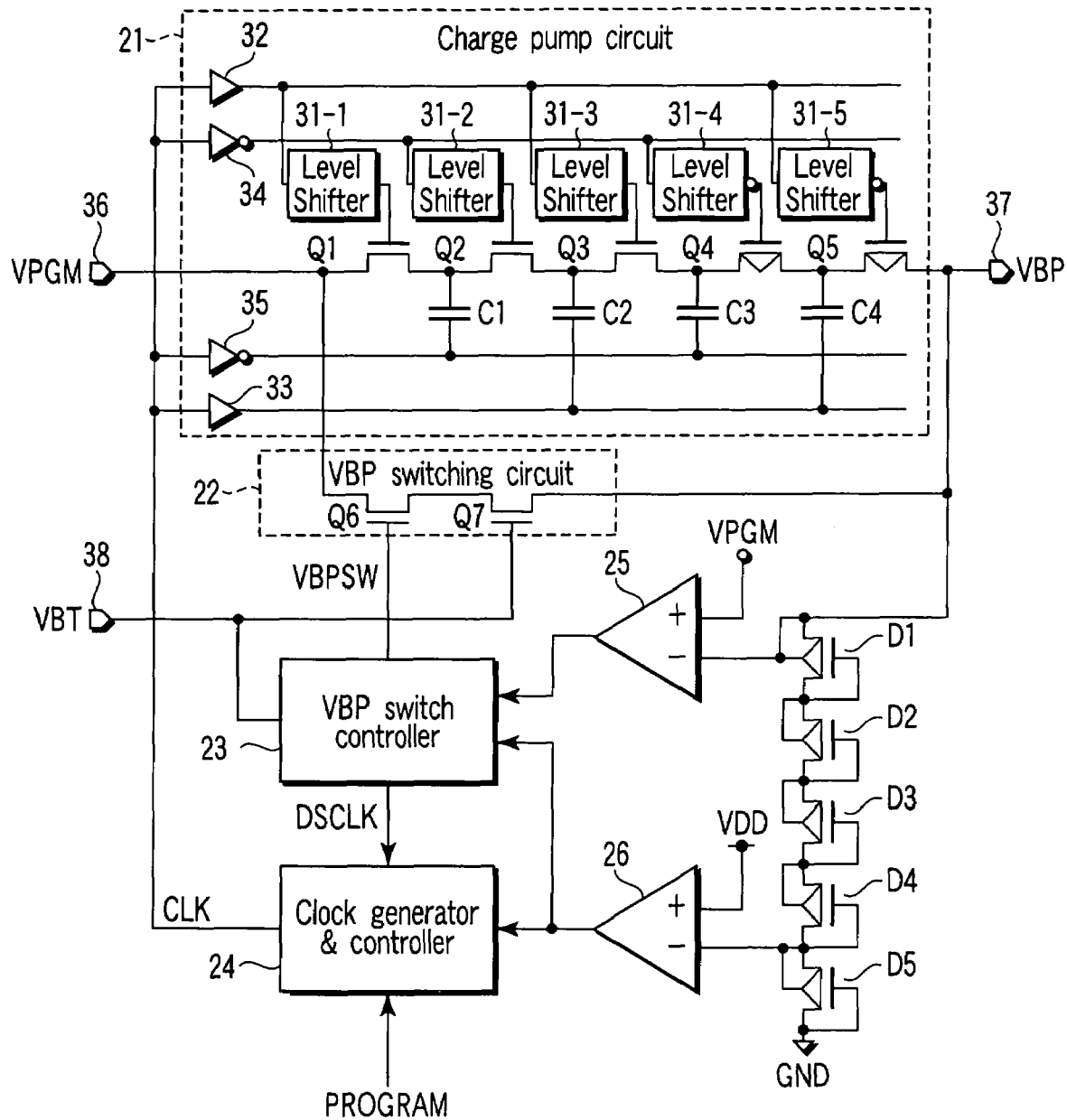
FIG. 1 is a circuit diagram for explaining a semiconductor integrated circuit device according to an embodiment of the present invention, in which a program circuit is illustrated.

FIGS. 1 and 2 are views for explaining a semiconductor integrated circuit device according to an embodiment of the present invention. FIG. 1 is a circuit diagram showing a program circuit. FIG. 2 is a circuit diagram showing an outline of the arrangement of a semiconductor one-time programmable memory.

As shown in FIG. 2, cells MC[0,09 to MC[(n−1),(m−1)] as storage elements are arranged in a matrix. Each of the cells MC[0,0] to MC[(n−1),(m−1)] includes a P-channel MOS transistor MP which functions as an e-fuse, and an N-channel MOS transistor MN. The MOS transistors MN in the cells MC[0,0] to MC[(n−1), (m−1)] have gates connected to word lines WL[0] to WL[n−1] in the individual rows, and sources connected to bit lines BL[0] to BL[m−1] in the individual columns. Each MOS transistor MN functions as both a bit selector and barrier transistor.

The word lines WL[0] to WL[n−1] are supplied with outputs from a row decoder 11. The row decoder 11 decodes a row address signal to select the word lines WL[0] to WL[n−1].

One terminal of the e-fuse (the gate of the MOS transistor MP) is connected to the drain of the MOS transistor MN in each of the cells MC[0,0] to MC[(n−1), (m−1)]. The other terminals of the e-fuse (the source, drain, and back gate of the MOS transistor MP) are connected together to the output terminal of a program circuit 12. The program circuit 12 generates a high-voltage VBP for programming under the control of a program signal PROGRAM.

The drains of P-channel MOS transistors QP0 to QP(m−1) are respectively connected to the bit lines BL[0] to BL[m−1]. Each of the MOS transistors QP0 to QP(m−1) has a source and back gate connected to the output terminal of a VBT generator 13, and a gate connected to one of signal lines CP[0] to CP[m−1]. A voltage VBT output from the VBT generator 13 is intermediate between a power supply voltage VDD and the output voltage VBP from the program circuit 12. The output voltage VBT from the VBT generator 13 is also supplied to the row decoder 11 and a column decoder 14. The outputs from the column decoder 14 are supplied to the signal lines CP[0] to CP[m−1].

The drains and sources of N-channel MOS transistors QN0 to QN(m−1) are connected between the bit lines BL[0] to BL[m−1] and GND. The gates of the MOS transistors QN0 to QN(m−1) are respectively connected to signal lines CN[0] to CN[m−1]. The signal lines CN[0] to CN[m−1] are supplied with the outputs from the column decoder 14.

The column decoder 14 decodes a column address signal to select the signal lines CP[0] to CP[m−1] and CN[0] to CN[m−1].

Each of the bit lines BL[0] to BL[m−1] has a sense amplifier (S/A) 15-0 to 15-(m−1) having the same arrangement as a circuit shown in FIG. 5B of the reference described previously. The sense amplifiers 15-0 to 15-(m−1) are functions as a sensing circuit which senses the irreversibly changed element characteristics of a storage element (cell) in distinction from an unchanged state.

To program data in the arrangement as described above, the row decoder 11 initially holds all the word lines WL[i] (i=0 to n−1) at the VBT level, and the column decoder 14 initially holds all the bit lines BL[j] (j=0 to m−1) at the VBT level. Then, unselected word lines except for the selected word line are dropped to the GND level in accordance with an input row address, and both corresponding signal lines CP[j] and CN[j] are set at the VBT level in accordance with an input column address, thereby dropping the selected bit line to the GND.

In this manner, only one specific bit can be programmed by applying a high voltage to it.

To set the programmed e-fuse element in a stable low-resistance state, the program circuit 12 supplies an electric current on the order of a few mA to the cell for about a few hundred μsec to 1 msec. This electric current changes in accordance with the process used or the actual circuit configuration.

FIG. 1 shows a practical arrangement of the program circuit 12 in the circuit shown in FIG. 2. The program circuit 12 comprises a charge pump circuit 21, VBP switching circuit 22, VBP switch controller 23, clock generator & controller 24, comparators 25 and 26, diode-connected P-channel MOS transistors D1 to D5, and the like.

The charge pump circuit 21 forms a high-voltage generator in the program circuit 12, and is a multistage circuit. The charge pump circuit 21 generates the high voltage VBP for programming by boosting a boosting power supply VPGM, and includes N-channel MOS transistors Q1 to Q3, P-channel MOS transistors Q4 and Q5, level shifters 31-1 to 31-5, capacitors C1 to C4, buffers 32 and 33, and inverters 34 and 35. The current paths of the MOS transistors Q1 to Q5 are connected in series between a terminal 36 to which the boosting power supply VPGM is applied and a terminal 37 which outputs the high voltage VBP. The outputs from the level shifters 31-1 to 31-3 are supplied to the gates of the MOS transistors Q1 to Q3, and the inverted outputs from the level shifters 31-4 and 31-5 are supplied to the gates of the MOS transistors Q4 and Q5. The output from the buffer 32 is supplied to the level shifters 31-1, 31-3, and 31-5, and the output from the inverter 34 is supplied to the level shifters 31-2 and 31-4.

The capacitor C1 has one electrode connected to the connecting point of the current paths of the MOS transistors Q1 and Q2, and the other electrode connected to the output terminal of the inverter 35. The capacitor C2 has one electrode connected to the connecting point of the current paths of the MOS transistors Q2 and Q3, and the other electrode connected to the output terminal of the buffer 33. The capacitor C3 has one electrode connected to the connecting point of the current paths of the MOS transistors Q3 and Q4, and the other electrode connected to the output terminal of the inverter 35. The capacitor C4 has one electrode connected to the connecting point of the current paths of the MOS transistors Q4 and Q5, and the other electrode connected to the output terminal of the buffer 33.

The clock generator & controller 24 supplies a clock CLK to the input terminals of the buffers 32 and 33 and inverters 34 and 35.

The VBP switching circuit 22 includes two N-channel MOS transistors Q6 and Q7. The current paths of the MOS transistors Q6 and Q7 are connected in series between the terminal 36 to which the boosting power supply VPGM is applied and the terminal 37 which outputs the high voltage VBP. That is, the charge pump circuit 21 and VBP switching circuit 22 are connected in parallel between the terminals 36 and 37. The gate of the MOS transistor Q6 is supplied with a switch control signal VBPSW output from the VBP switch controller 23. The gate of the MOS transistor Q7 is connected to a terminal 38 to which the voltage VBT is applied. This prevents a high voltage for programming from being directly applied to one N-channel MOS transistor, as in the barrier transistor of the e-fuse element.

The comparator 25 has a first input terminal (+) connected to the boosting power supply VPGM, and a second input terminal (−) connected to the source and back gate of the MOS transistor D1. The gate and drain of the MOS transistor D1 are respectively connected to the source and back gate of the MOS transistor D2. The gate and drain of the MOS transistor D2 are respectively connected to the source and back gate of the MOS transistor D3. The gate and drain of the MOS transistor D3 are respectively connected to the source and back gate of the MOS transistor D4. The gate and drain of the MOS transistor D4 are respectively connected to the source and back gate of the MOS transistor D5. The gate and drain of the MOS transistor D5 are connected to the ground point GND. The diode-connected MOS transistors D1 to D5 described above function as a voltage divider which applies a voltage obtained by dividing the high voltage VBP to the second input terminal (−) of the comparator 26.

The comparator 26 has a first input terminal (+) connected to the power supply VDD, and the above-mentioned second input terminal (−) connected to the source and back gate of the MOS transistor D5.

The outputs from the comparators 25 and 26 are supplied to the VBP switch controller 23. The MOS transistor Q6 of the VBP switching circuit 22 is controlled by the switch control signal VBPSW output from the VBP switch controller 23, and the operation of the clock generator & controller 24 is controlled by a clock stop signal DSCLK. The voltage VBT intermediate between the power supply voltage VDD and the output voltage VBP of the program circuit 12 is applied from the terminal 38 to the VBP switch controller 23.

The clock generator & controller 24 is supplied with the clock stop signal DSCLK, the program signal PROGRAM, and the output signal from the comparator 26, and outputs the clock CLK to control the operation of the charge pump circuit 21.

In the arrangement as described above, when the program signal PROGRAM is raised from the GND level to the VDD level, the clock generator & controller 24 outputs the clock CLK, and the charge pump circuit 21 operates to boost the boosting power supply VPGM. This raises the VBP level of the terminal 37. When the charge pump circuit 21 is performing the boosting operation, the switch control signal VBPSW output from the VBP switch controller 23 is at the GND level, so the MOS transistor Q6 is kept off. Once the VBP level of the terminal 37 reaches to the program voltage, the clock generator & controller 24 intermittently operates the charge pump circuit 21 for a period during which the VBP level is held. This intermittent operation can be implemented by use of the comparator 26. For example, if the output voltage (source voltage of the transistor D5) of the voltage divider becomes higher than the VDD level, the clock stop signal DSCLK outputted from VBP switch controller 23 is at the VDD level in response to output of the comparator 26, and the clock CLK fall to the VSS level. On the other hand, if the output voltage of the voltage divider becomes lower than the VDD level, the clock stop signal DSCLK is the VSS level in response to output of the comparator 26, and the clock CLK is output from the clock generator & controller 24. Thus, the clock generator & controller 24 holds the VBP level at a constant value by controlling the start and stop of the clock CLK.

When the address of a specific cell to be programmed is input to select a word line and bit line, the program voltage VBP is applied to the selected cell, and the oxide of the e-fuse element breaks down.

Since the current supply capability of the charge pump circuit 21 is small, the level of the VBP largely lowers immediately after the breakdown. If the comparator 25 senses that the VBP level is lower than the VPGM, the VBP switch controller 23 raises the switch control signal VBPSW from the GND level to the VBT level, thereby connecting the VPGM and VBP, and directly supplying an electric current from the VPGM to the e-fuse element. The VBP switch controller 23 also raises the signal DSCLK to the VDD level to suppress the operation of the charge pump circuit.

In this manner, the specific cell to be programmed can be stabilized in a hard breakdown state by the Joule heating effect.

In this embodiment as described above, in an OTP memory using the gate oxide e-fuse as a storage element, a circuit which generates a high voltage required to program the e-fuse and a circuit which supplies an electric current for stabilizing the element characteristics are different circuits. Therefore, the current supply capability of the charge pump circuit 21 can be decreased. That is, the charge pump circuit 21 need only have current supply capability by which the level of the VBP can be raised to a predetermined voltage, so the sizes of the capacitor, the transfer gate, and the buffer for driving them can be as small as a fraction of those of the conventional components. Accordingly, the pattern occupied area of the charge pump circuit 21 can be reduced without deteriorating the reliability of programming of the e-fuse.

The present invention has been explained by using the above embodiment. However, the present invention is not limited to the above embodiment, and can be variously modified when practiced without departing from the spirit and scope of the invention. For example, in the above explanation, the comparator 25 compares the VBP with the VPGM. However, as in the control of the charge pump circuit 21 by the clock generator & controller 24, it is also possible to compare a voltage generated by dividing the VBP by resistances (the dividing ratios are of course different) with the VDD.

As described above, according to one aspect of this invention, it is possible to obtain a semiconductor integrated circuit device capable of reducing the pattern occupied area of a program circuit without deteriorating the reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising: a storage element configured to store information by electrically irreversibly changing element characteristics; a program circuit configured to program the storage element by electrically irreversibly changing the element characteristics thereof, the program circuit comprising a high-voltage generator which irreversibly changes the element characteristics of the storage element by applying a high voltage thereto, and a current source which supplies an electric current to the storage element having element characteristics changed by the high-voltage generator, thereby stabilizing the element characteristics; and
   a sensing circuit configured to sense the irreversibly changed element characteristics of the storage element in distinction from an unchanged state;
   wherein the current source comprises a switching circuit configured to supply an electric current from the current source to the storage element having the changed element characteristics when an output voltage from the high-voltage generator lowers, said switching circuit comprising a first MOS transistor and second MOS transistor having current paths connect in series between an input terminal and output terminal of the high-voltage generator, wherein ON/OFF of the first MOS transistor is controlled on the basis of the output voltage from the high-voltage generator being lowered, and a voltage intermediate between a power supply voltage and the output voltage of the high-voltage generator is applied to a gate of the second MOS transistor.

2. The device according to claim 1, wherein the switching circuit stabilizes the element characteristics by a Joule heat generated in the storage element.

3. The device according to claim 2, further comprising a first comparator configured to compare an input voltage and output voltage of the high-voltage generator, and a switch controller configured to control the switching circuit on the basis of a comparison result from the first comparator.

4. The device according to claim 3, wherein ON/OFF of the MOS transistor is controlled by an output voltage of the switch controller.

5. The device according to claim 3, further comprising a voltage divider which divides the output voltage of the high-voltage generator, a second comparator configured to compare the power supply voltage with an output voltage of the voltage divider, and a clock generator & controller configured to generate a clock on the basis of a comparison result from the second comparator, and supply the clock to the high-voltage generator.

6. The device according to claim 5, wherein the switch controller is configured to further receive the comparison result from the first comparator, and supplies a clock control signal to the clock generator & controller to control an operation thereof.

7. The device according to claim 6, wherein the clock generator & controller is configured to be controlled by further receiving a program signal.

8. The device according to claim 5, wherein the voltage divider comprises resistor elements in series.

9. The device according to claim 8, wherein the resistor elements comprises a plurality of diode-connected MOS transistors.

10. The device according to claim 1, wherein the high-voltage generator comprises a charge pump circuit.

11. The device according to claim 1, wherein the storage element has a structure substantially equal to a MOS transistor, and a resistance value irreversibly changes due to dielectric breakdown when a high voltage is applied to a gate oxide of the MOS transistor from the high-voltage generator in the program circuit.

* * * * *